United States Patent
Kiritani et al.

(10) Patent No.: US 7,920,012 B2
(45) Date of Patent: *Apr. 5, 2011

(54) SEMICONDUCTOR DEVICE

(75) Inventors: Masahide Kiritani, Hyogo (JP); Noriko Sonoda, Hyogo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/797,812

(22) Filed: Jun. 10, 2010

(65) Prior Publication Data

US 2010/0244924 A1  Sep. 30, 2010

Related U.S. Application Data

(63) Continuation of application No. 12/146,964, filed on Jun. 26, 2008, now Pat. No. 7,746,147.

(30) Foreign Application Priority Data

Jun. 29, 2007  (JP) .................................. 2007-171472

(51) Int. Cl.
H03L 5/00  (2006.01)

(52) U.S. Cl. .............................. 327/333; 326/63; 326/81

(58) Field of Classification Search .............. 326/62–63, 326/80–81; 327/306, 333
See application file for complete search history.

(56) References Cited

U.S. PATENT DOCUMENTS

| 5,461,333 A * | 10/1995 | Condon et al. ................. 327/208 |
| 6,002,290 A | 12/1999 | Avery et al. |
| 6,462,602 B1 | 10/2002 | Potter |
| 6,864,736 B2 | 3/2005 | Guedon et al. |
| 6,985,022 B2 * | 1/2006 | Kanno et al. ................... 327/333 |

FOREIGN PATENT DOCUMENTS

| JP | 05-007151 | 1/1993 |
| JP | 10-084274 | 3/1998 |
| JP | 2003-017996 | 1/2003 |
| JP | 2003-078410 | 3/2003 |
| JP | 2005-020083 | 1/2005 |
| JP | 2005-354207 | 12/2005 |

* cited by examiner

*Primary Examiner* — Dinh T. Le
(74) *Attorney, Agent, or Firm* — McDermott Will & Emery LLP

(57) ABSTRACT

A level shifter circuit of the present invention includes a level shifter for converting a low-voltage signal to a high-voltage signal, and is provided with a unit that sets a voltage condition of an input signal to a transistor for input of the level shifter, when a high-voltage power supply is inputted to the level shifter circuit of the present invention before a low-voltage power supply.

2 Claims, 8 Drawing Sheets

F I G . 4
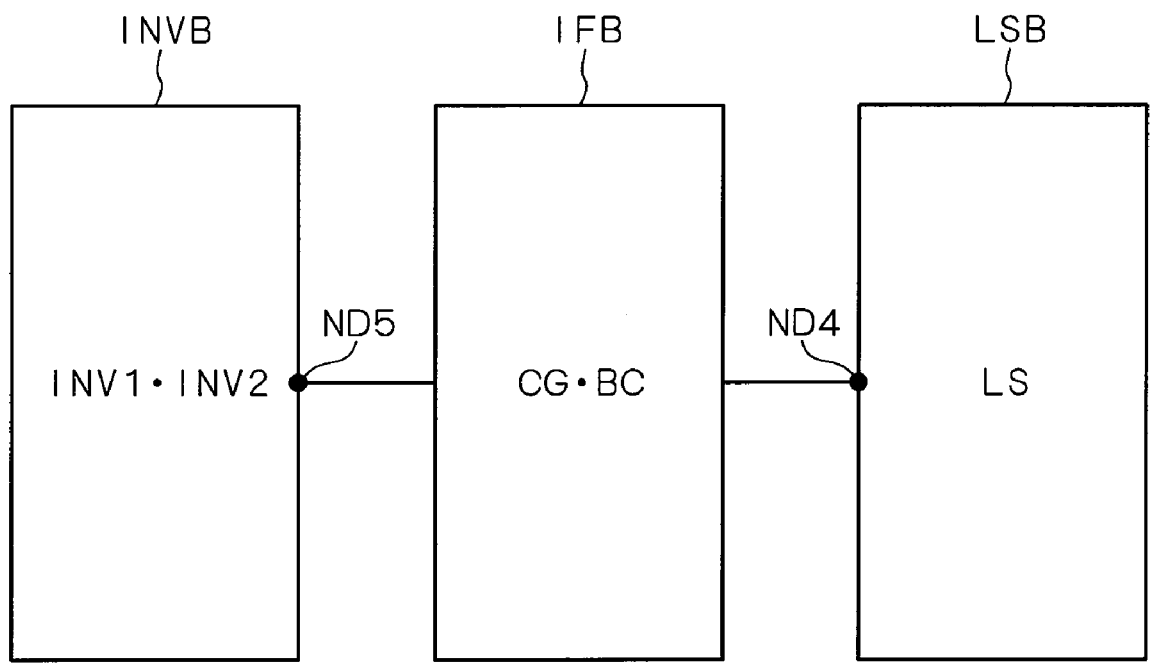

F I G . 6
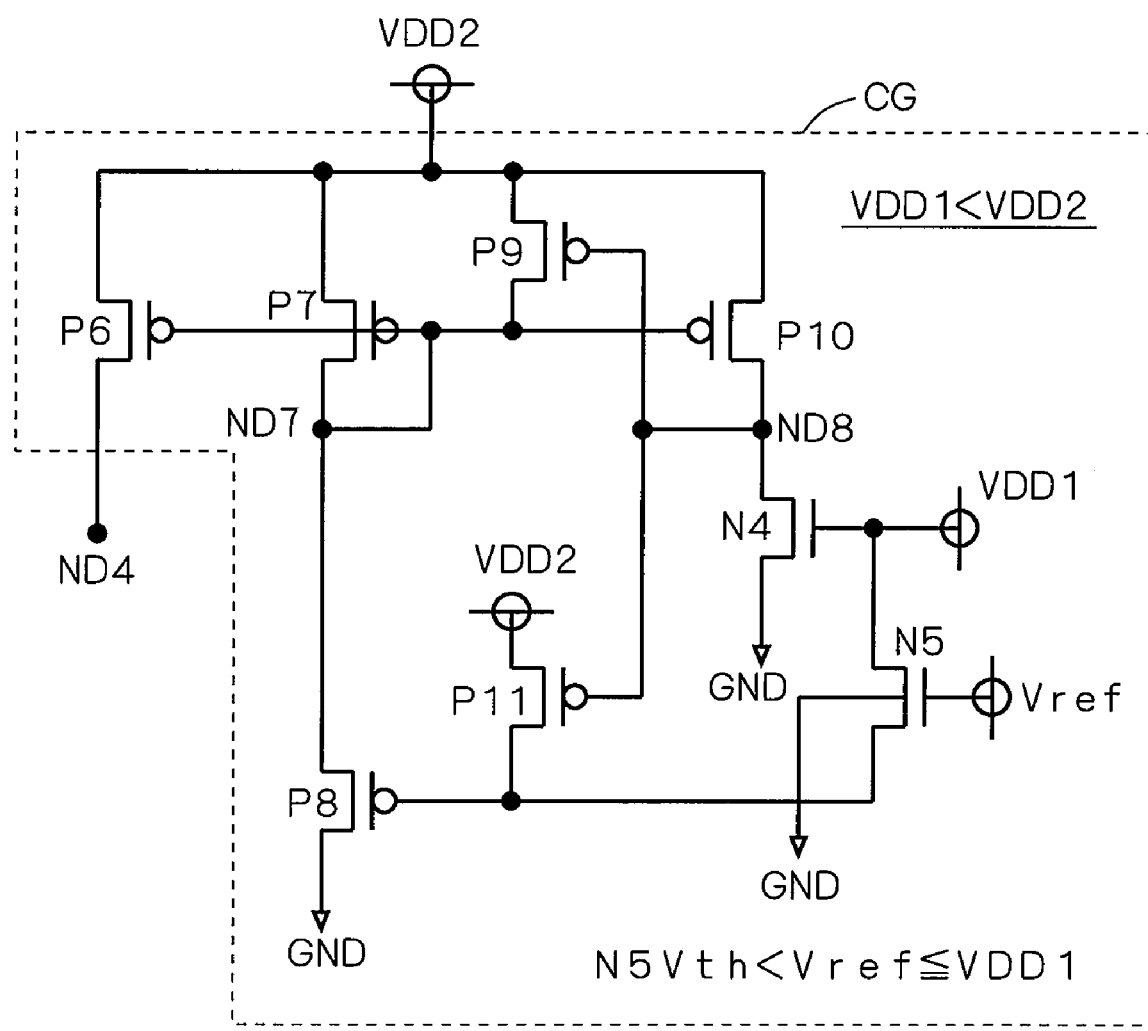

F I G . 9
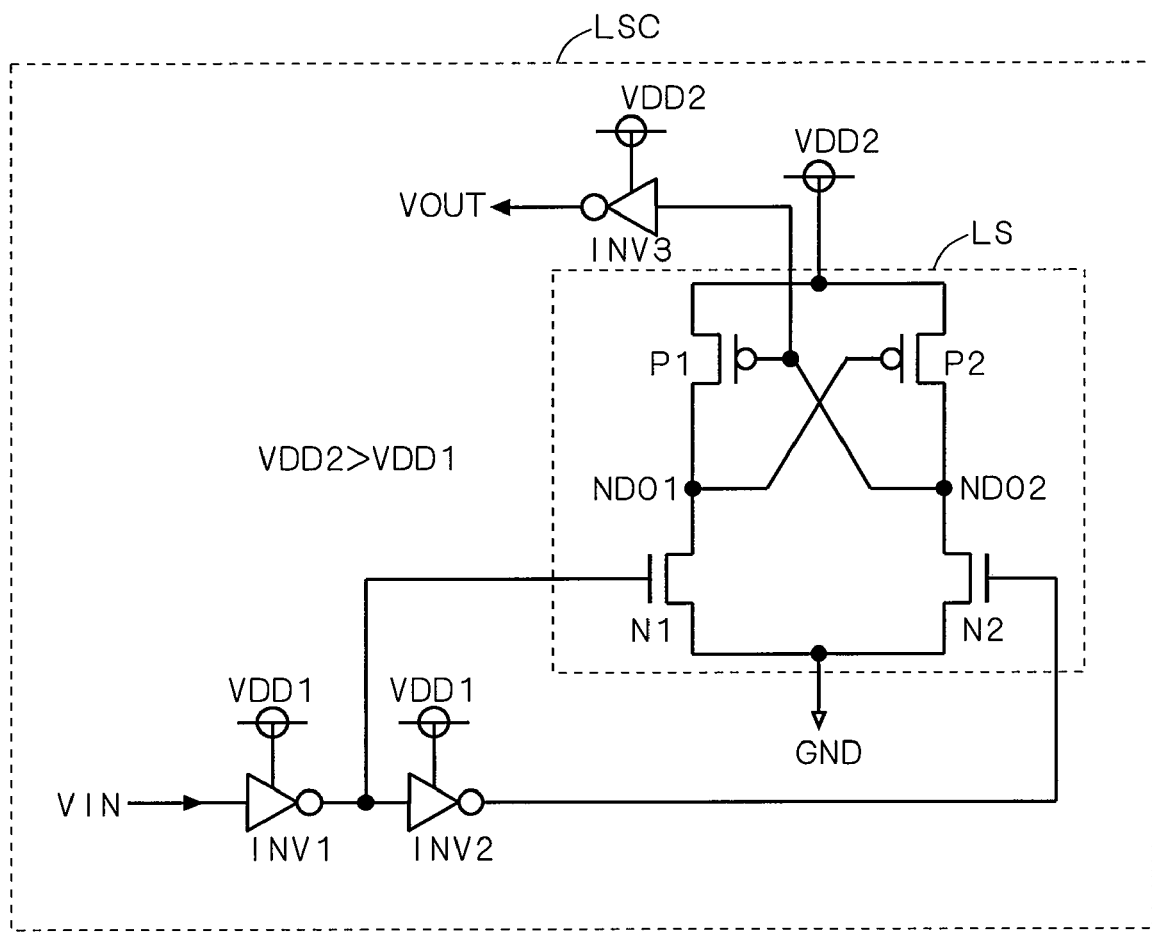

US 7,920,012 B2

SEMICONDUCTOR DEVICE

CROSS-REFERENCE TO RELATED APPLICATIONS

This application is a Continuation of U.S. application Ser. No. 12/146,964, filed on Jun. 26, 2008, now U.S. Pat. No. 7,746,147 claiming priority of Japanese Patent Application No. 2007-171472, filed on Jun. 29, 2007, the entire contents of each of which are hereby incorporated by reference.

BACKGROUND OF THE INVENTION

1. Field of the Invention

The present invention relates to a semiconductor device, and more particularly, to a configuration of a level shifter circuit.

2. Description of the Background Art

A term "MOS" has been used in the past for a laminated structure of metal/oxide/semiconductor, and this is an acronym of Metal-Oxide-Semiconductor. However, especially in a field-effect transistor having a MOS structure (hereinafter, simply referred to as "MOS transistor"), materials of a gate insulating film and a gate electrode are improved from a viewpoint of a recent improvement in integration and manufacturing processes.

For example, in the MOS transistor, a polycrystalline silicon has been adopted as the material of the gate electrode in place of metals, mainly from the viewpoint of forming self-aligning source and drain. Also, although a high-dielectric material is adopted as the material of the gate insulating film from the viewpoint of improving electrical characteristics, the material is not necessarily limited to oxides.

Therefore, the term "MOS" is not necessarily used exclusively for the laminated structure of metal/oxide/semiconductor, and in this specification also, such a limitation is not predicated. That is, in view of the common technical knowledge, the term "MOS" herein has a meaning not only as the ethymological acronym but also widely encompassing the laminating structure of conductor/insulator/semiconductor. Therefore, the term of MOS transistor is used in referring to an insulated gate field-effect transistor in which the gate electrode and the source/drain are electrically (galvanically) isolated.

FIG. 9 shows a conventional level shifter circuit LSC. The level shifter circuit LSC is a circuit for converting an input signal VIN to an output signal VOUT having a voltage level higher than that of the input signal VIN and outputting the same. The level shifter circuit LSC includes inverter circuits INV1 and INV2 acting as a pre-driver, a level shifter LS, and an inverter circuit INV3 which is an output driver.

The level shifter LS includes a P-channel MOS transistor P1 and an N-channel MOS transistor N1 connected in series between a power supply VDD2 and a reference power supply GND, and a P-channel MOS transistor P2 and an N-channel MOS transistor N2 connected in series between the power supply VDD2 and the reference power supply GND. A node ND01 is provided between the P-channel MOS transistor P1 and the N-channel MOS transistor N1, and the node ND01 is connected to a gate of the P-channel MOS transistor P2. A node ND02 is provided between the P-channel MOS transistor P2 and the N-channel MOS transistor N2, and the node ND02 is connected to a gate of the P-channel MOS transistor P1. Also, a complementary signal corresponding to the input signal VIN is inputted to each of the gates of the N-channel MOS transistors N1 and N2 (transistors for input). The power supply VDD1 is supplied to the inverter circuits INV1 and INV2, and the power supply VDD2 is supplied to the level shifter LS and the inverter circuit INV3, and an equation of power supply VDD1 (low-voltage supply)<power supply VDD2 (high-voltage supply) is satisfied.

In the conventional level shifter circuit LSC shown in FIG. 9, a rising operation at the time of power activation is not sufficiently considered. That is, depending on an order of the power activation of the power supplies VDD1 and VDD2, an operation of the level shifter LS might be unstable. Next, the rising operation of the level shifter circuit LSC at the time of power activation will be described.

First, a case in which the power supply VDD1 rises before the power supply VDD2 will be described. When the power supply VDD1 rises, each voltage level of signals inputted to the gates of the N-channel MOS transistors N1 and N2 is either a high level (power supply VDD1) or a lower level (reference power supply GND) depending on an input voltage signal VIN, that is, complementary signals are inputted to the gates of the N-channel MOS transistors N1 and N2. Further, when the power supply VDD2 rises, each of the nodes ND01 and 02 is fixed to either voltage level of the high level (power supply VDD2) and the low level (reference power supply GND) depending on the signals inputted to the gates of the N-channel MOS transistors N1 and N2, and the level shifter LS operates in a stable manner (output signal VOUT is defined).

Next, a case in which the power supply VDD2 rises before the power supply VDD1 will be described. In this case, the complementary signals are not inputted to the gates of the N-channel MOS transistors N1 and N2, and a voltage condition of each of the nodes ND01 and ND02 is not stabilized, so that the operation of the level shifter LS becomes unstable (output signal VOUS becomes undefined).

That is, in the level shifter circuit LSC as in FIG. 9, in a state in which the power is activated and only the high-voltage power supply VDD2 rises, the complementary signal is not inputted to each transistor for input, so that there is a possibility that the output signal VOUT becomes undefined. Meanwhile, the normal operation of the level shifter circuit LSC (a case in which both of the power supplies VDD1 and VDD2 are supplied) is disclosed in FIG. 8 of Japanese Patent Application Laid-Open No. 2003-17996 to be mentioned later, so that this is not described here.

With regard to such an operation at the time of power activation, a configuration intended for assuring a stable operation irrespective of the order of power activation has been proposed.

In Japanese Patent Application Laid-Open No. 2003-17996, there is arranged a capacitative element or a resistance element between the high-voltage power supply or the ground and the input terminal of the transistor for input of the level shifter, as means for fixing the input signal to the transistor for input of the level shifter. As a result, a pass-through current at the time of power activation is prevented.

In Japanese Patent Application Laid-Open No. 10-84274, there is arranged a switch transistor at a differential circuit section at which a signal is converted to a high voltage of the level shifter circuit. By configuring to turn on and off the switch transistor in synchronization with the control of the low-voltage power supply, the signal at the differential circuit section is fixed, and the output status is fixed to a desired signal level by a pull up transistor or a pull down transistor provided on the output terminal, thereby preventing a condition in which the circuit output is undefined.

In Japanese Patent Application Laid-Open No. 2005-354207, an N-type transistor, which may be used for resetting at the time of turning off the internal power supply, is connected to two drain terminals of cross-coupled P-type transistors in the level shifter. With this configuration, output buffer false operation at the time of power activation is prevented.

Japanese Patent Application Laid-Open No. 05-7151 includes a current bypass circuit between a common drain end and a ground potential point of an MOS inverter on the output side. With this configuration, the output of the level shifter circuit is stabilized.

In this manner, attempts are made to stabilize the operation of the level shifter circuit at the time of power activation. However, in these documents, an area of the circuit added for the stable operation is not sufficiently considered.

SUMMARY OF THE INVENTION

A first object of the present invention is to provide a level shifter circuit of which operation does not become unstable, even when only a power supply of a high-voltage side is activated at the time of power activation, a second object is to provide a level shifter circuit in which a signal output is fixed and which operates in a stable manner, even when only the power supply of the high-voltage side is activated at the time of power activation, and further, a third object is to suppress a leak current at a voltage detection section used in the level shifter circuit.

An aspect of a semiconductor device according to the present invention is to provide a circuit for fixing an input signal of the level shifter when only a high-voltage power supply is activated.

According to the above-described semiconductor device, it is possible to prevent a condition in which the level shifter unstably operates when only the high-voltage power supply is activated.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows a schematic diagram of a layout of the semiconductor device shown in FIG. 2;

FIG. 6 is a schematic diagram showing an entire configuration of a current generating circuit according to a fourth embodiment of the present invention;

FIG. 9 is a diagram showing the conventional level shifter circuit.

DESCRIPTION OF THE PREFERRED EMBODIMENTS

First Embodiment

Figure 1:
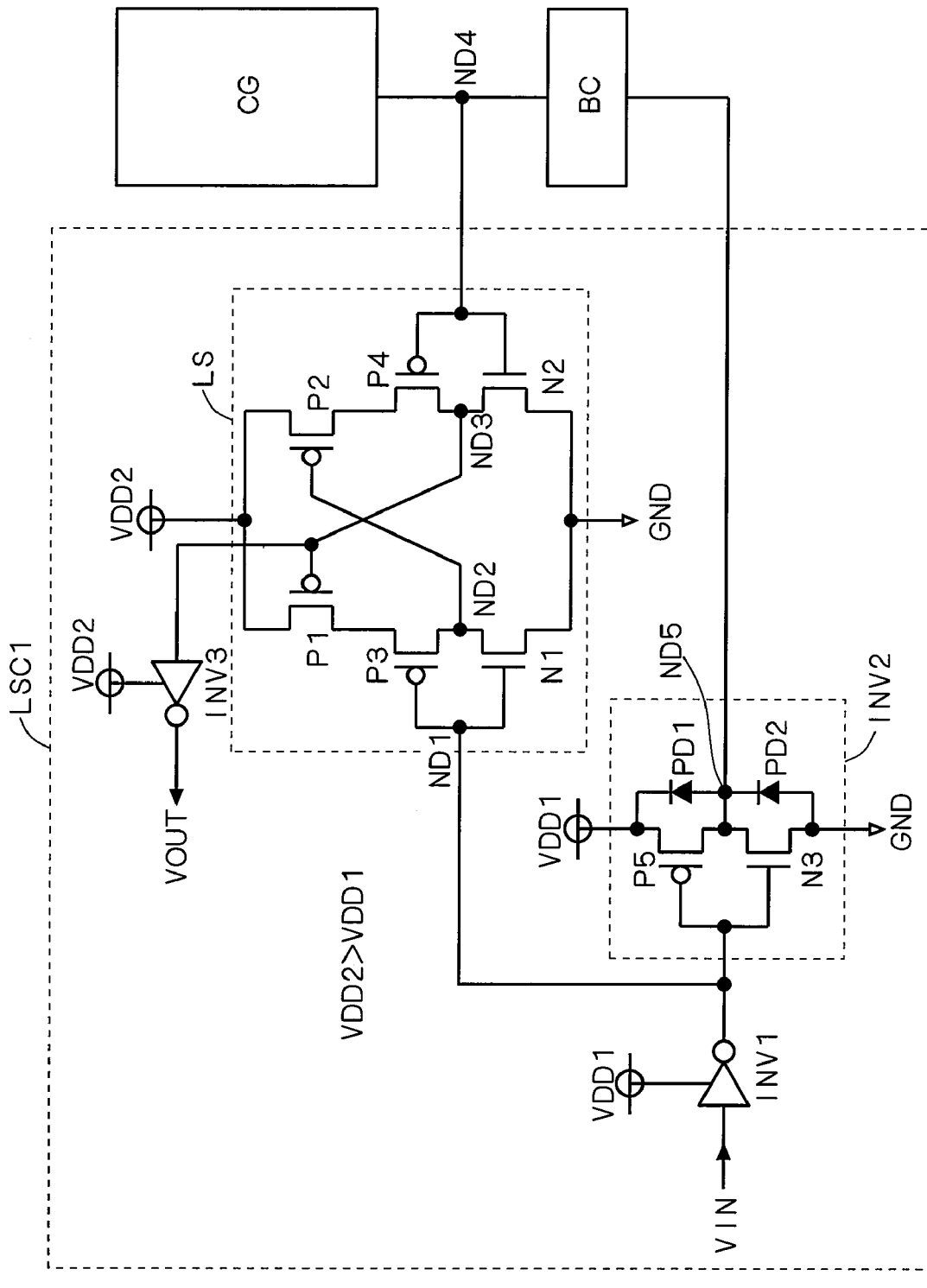
FIG. 1 is a schematic diagram showing an entire configuration of a semiconductor device according to a first embodiment of the present invention.

FIG. 1 is a schematic diagram showing an entire configuration of a semiconductor device according to a first embodiment of the present invention. In a circuit configuration shown in FIG. 1, the same reference numerals are used for portions corresponding to those in the configuration shown in FIG. 9, and a detailed description thereof is not given.

A level shifter circuit LSC1 according to the present embodiment further has a current generating circuit CG and a bias circuit BC as circuits for preventing an unstable operation of a level shifter LS at the rising of a power supply, in addition to the conventional level shifter circuit LSC shown in FIG. 9.

The level shifter LS is obtained by adding P-channel MOS transistors P3 and P4 to the configuration of the level shifter LS shown in FIG. 9. A node (input terminal), which is connected to each gate of the P-channel MOS transistor P3 and an N-channel MOS transistor N1, is a node ND1, and a node (output terminal), which is connected to each drain of the P-channel MOS transistor P3 and the N-channel MOS transistor N1, is a node ND2. Also, a node (input terminal), which is connected to each gate of the P-channel MOS transistor P4 and an N-channel MOS transistor N2, is a node ND4, and a node (output terminal), which is connected to each drain of the P-channel MOS transistor P4 and the N-channel MOS transistor N2, is a node ND3.

The P-channel MOS transistor P3 and the N-channel MOS transistor N1, and the P-channel MOS transistor P4 and the N-channel MOS transistor N2 configure inverters, respectively. Each of these inverters outputs an inverted voltage condition to the nodes ND2 and ND3, respectively, depending on voltage conditions of the nodes ND1 and ND 4.

An inverter circuit INV2 is configured by a P-channel MOS transistor P5 and an N-channel MOS transistor N3, which are connected in series between a power supply voltage VDD1 and a reference power supply GND. Also, the P-channel MOS transistor P5 and the N-channel MOS transistor N3 are shown with a parasitic diode PD1 formed of an N-well and a diffusion layer of the drain, and a parasitic diode PD2 formed of a P-well and a diffusion layer of the drain, respectively. In the present embodiment, the parasitic diodes PD1 and PD2 are used as a current path. A node (output terminal of the inverter circuit INV2) between the bias circuit BC and the inverter circuit INV2 is a node ND 5.

Next, the current generating circuit CG and the bias circuit BC will be described. The current generating circuit CG is a circuit which applies a current to the node ND4 only when a power supply VDD2 rises before the power supply VDD1 does (a case in which the power supply VDD1 is off and the power supply VDD2 is on). In addition, the bias circuit BC raises a voltage level of the node ND4 based on the current from the current generating circuit CG.

Next, a rising operation of the level shifter LSC1 at the time of power activation will be described based on the semiconductor device shown in FIG. 1.

First, a case in which the power supply VDD 1 rises before the power supply VDD2 does (a case in which the power supply VDD1 is on and the power supply VDD2 is off) will be described. When the power supply VDD1 rises, a current does not flow from the current generating circuit to the node ND4, so that the level shifter circuit LSC1 operates in a way similar to the level shifter circuit LSC shown in FIG. 9.

Next, a case in which the power supply VDD2 rises before the power supply VDD1 does (a case in which the power supply VDD1 is off and the power supply VDD2 is on) will be described. In this case, a current is generated in the current generating circuit CG. This current flows from the current generating circuit CG (power supply VDD2) through the node ND4, the bias circuit BC, and the parasitic diode PD1 to the power supply VDD1 in an off state. At this time, the voltage condition of the node ND4 is higher than that of the power supply VDD1 by an amount of the voltage raised by a forward voltage Vf of the parasitic diode PD1 and the bias circuit BC. Meanwhile, the bias circuit is set such that the voltage condition of the node ND4 at that time is higher than a threshold voltage at which the N-channel MOS transistor N2 is in a conduction state. As a result, the N-channel MOS transistor N2 become conductive and the voltage conditions of the nodes ND 2 and ND3 become complementary, whereby the operation of the level shifter LS is stabilized. Then, when the power supply VDD1 rises, the current from the current generating circuit CG does not flow, and after that, an input signal to the level shifter LS is fixed by an input signal VIN and the inverter circuits INV1 and INV2, and the level shifter LS operates in a stable manner (operates normally).

In this manner, by using the semiconductor device shown in FIG. 1, a problem of unstable operation at the time of power activation in the conventional level shifter circuit LSC can be solved.

Also, the circuit configuration of the level shifter is for generating an output signal VOUT of the level shifter depending the on/off status of a transistor for input (corresponding to the P-channel MOS transistors P3 and P4 and the N-channel MOS transistors N1 and N2, in FIG. 1), and this is not limited to that shown in this specification so long as this is the one for converting a low-voltage input signal VI to a high-voltage output signal VOUT depending on the output signal of a pre-driver (corresponding to the inverter circuits INV1 and INV 2, in FIG. 1).

Second Embodiment

Figure 2:
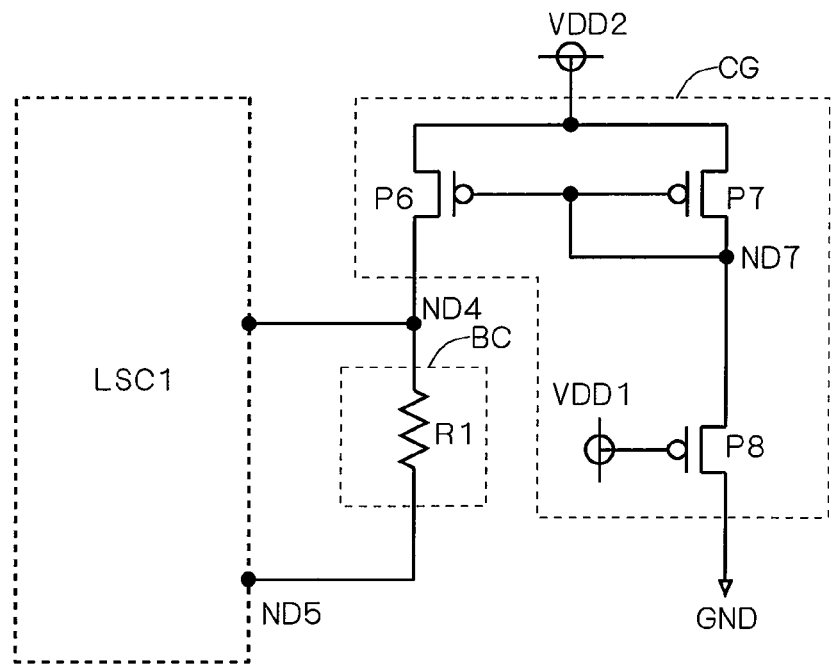
FIG. 2 is a diagram showing an example of a current generating circuit CG and a bias circuit BC configuring the semiconductor device shown in FIG. 1.

FIG. 2 shows a specific example of the current generating circuit CG and the bias circuit BC configuring the semiconductor device shown in FIG. 1. In a circuit configuration shown in FIG. 2, the same reference numerals are used for portions corresponding to those in the configuration shown in FIG. 1, and a detailed description thereof is not given. Also, the detailed circuit configuration of the level shifter circuit LSC1 is not shown in FIG. 2, and this will be described in the following description by using the reference numerals of the level shifter circuit LSC1 shown in FIG. 1.

The current generating circuit CG includes P-channel MOS transistors P6 to P8. The P-channel MOS transistor P6 is connected between the power supply VDD2 and the node ND4. The P-channel MOS transistor P7 is connected between the power supply VDD2 and a node ND7. Each gate of the P-channel MOS transistors P6 and P7 is connected to the node ND7. The P-channel MOS transistors P6 and P7 configure a current mirror circuit.

The P-channel MOS transistor P8 is connected between the node ND7 and the reference power supply GND and used as a constant current source. A gate of the P-channel MOS transistor P8 receives the power supply VDD1 and a conduction/non-conduction state thereof is decided by the voltage level thereof, and when the P-channel MOS transistor P8 is conductive, the current mirror circuit operates.

The bias circuit BC is formed of a resistance element R1. Although it is possible to use parasitic resistance such as wiring as the resistance element R1, it is required to set the voltage of the node ND4 to a value not lower than a threshold value at which the N-channel MOS transistor N2 becomes conductive, so that a resistor in addition to the parasitic resistance may be arranged in order to obtain a sufficient resistance value. However, the resistance value of this resistance element R1 is set to a value at which an operational problem such as an operation speed by delay does not matter in the normal operation. Specific examples of the resistance element R1 include a poly resistor and a diffusion resistor. In a case of a diffusion resistor, it is possible to use a P+ diffusion region of the P-channel MOS transistor P6.

Next, the rising operation of the level shifter circuit LSC1 at the time of power activation in a case where the current generating circuit CG and the bias circuit BC shown in FIG. 2 are used will be described.

First, a case in which the power supply VDD1 rises before the power supply VDD2 does (a state in which the power supply VDD1 is on and the power supply VDD2 is off) will be described. When the power supply VDD1 rises, the P-channel MOS transistor P8 becomes non-conductive. Therefore, a current does not flow to the P-channel MOS transistor P7, and a current does not flow to the P-channel MOS transistor P6. That is, a current does not flow from the current generating circuit CG to the node ND4, and the level shifter circuit LSC1 operates in a way similar to the case in which the power supply VDD1 rises before the power supply VDD2 does in the level shifter circuit LSC in FIG. 9.

Next, a case in which the power supply VDD2 rises before the power supply VDD1 does (a state in which the power supply VDD1 is off and the power supply VDD2 is on) will be described. In this case, since the power supply VDD1 has not risen, the P-channel MOS transistor P8 is in a conduction state and operates as a constant current source, and a current flows to the P-channel MOS transistor P7. Since the P-channel MOS transistors P6 and P7 configure a current mirror circuit, a current in the same direction flows also to the P-channel MOS transistor P6. That is, a current flows from the current generating circuit CG (P-channel MOS transistor P6) to the node ND4, and the current flows from the node ND4 through the resistance element R1 and the parasitic diode P1 to the power supply VDD1 of the inverter circuit INV2. At this time, the voltage condition of the node ND4 rises by the resistance element R1 to be higher than the threshold voltage at which the N-channel MOS transistor N2 becomes conductive, and the operation of the level shifter LS is stabilized.

At this time, the voltage condition of the node ND4 satisfies an equation of IR+Vf (based on the voltage of the power supply VDD1 in an off state) wherein the current flowing to the bias circuit BC is I and the resistance value of the resistance element R1 configuring the bias circuit is R. After that, when the power supply VDD1 rises, the P-channel MOS transistor P8 becomes non-conductive, and a current no longer flows from the current generation circuit CG to the node ND4. After that, the operation becomes normal, and a complementary signal to a signal inputted to the node ND1 is inputted to the node ND4 from an input voltage signal VIN through the inverter circuits INV1 and INV2, and the level shifter LS operates in a stable manner.

In this way, by using the current generating circuit CG and the bias circuit BC shown in FIG. 2, the problem of unstable operation at the time of power activation of the conventional level shifter circuit LSC can be solved.

Figure 3:
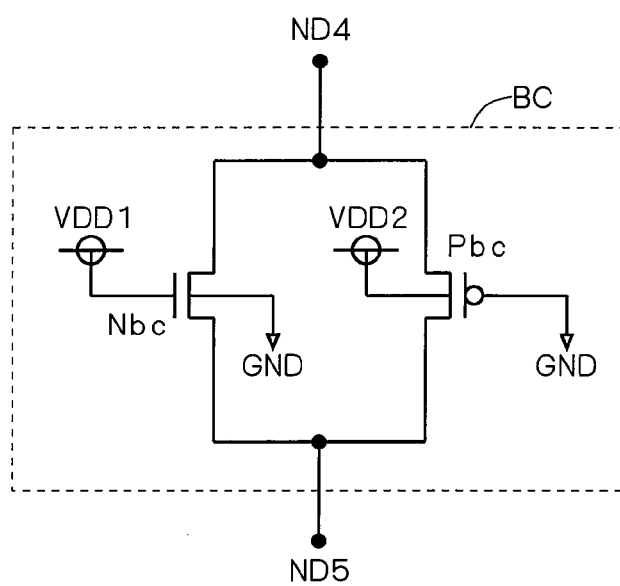
FIG. 3 is a diagram showing a modification of the bias circuit.

FIG. 3 shows a modification of the bias circuit BC. A circuit configuration shown in FIG. 3 is the modification of the bias circuit BC shown in FIG. 2, and an entire configuration thereof is the same as that in FIG. 2. Therefore, although not shown, the same reference numerals are used for corresponding portions and used in the later description.

In the bias circuit BC, a P-channel MOS transistor Pbc and an N-channel MOS transistor Nbc, which are connected in parallel between the nodes ND4 and ND5, are used. The P-channel MOS transistor Pbc and the N-channel MOS transistor Nbc configure a so-called transmission gate. The P-channel MOS transistor Pbc receives the reference power supply GND at a gate thereof, and the N-channel MOS transistor Nbc receives the power supply VDD1 at a gate thereof. In addition, a back gate of the P-channel MOS transistor Pbc receives the power supply VDD2, and the N-channel MOS transistor Nbc receives the reference power supply GND at a back gate thereof.

Next, the rising operation of the level shifter circuit LSC1 at the time of power activation in a case of using the bias circuit BC shown in FIG. 3 will be described.

First, a case in which the power supply VDD1 rises before the power supply VDD2 does (a state in which the power supply VDD1 is on and the power supply VDD2 is off) will be described. When the power supply VDD1 rises, the N-channel MOS transistor Nbc becomes conductive.

In this case, the level shifter LS operates in a way similar to a case in which the power supply VDD1 rises before the power supply VDD2 does in the level shifter circuit LSC of FIG. 9.

Next, a case in which the power supply VDD2 rises before the power supply VDD1 does (a state in which the power supply VDD1 is off and the supply VDD2 is on) will be described. In this case, in the bias circuit BC, the P-channel MOS transistor P9 becomes conductive, and the N-channel MOS transistor Nbc becomes non-conductive. At this time, the current from the current generating circuit CG flows from the node ND4 through the P-channel MOS transistor Pbc and the parasitic diode PD1 to the power supply VDD1 of the inverter circuit INV2. At this time, since the P-channel MOS transistor Pbc is diode-connected, the voltage condition of the node ND4 is a sum of a source-drain voltage by the diode-connection and the forward voltage of the parasitic diode PD1 (based on the voltage of the power supply VDD1 in an off state) and is higher than the threshold voltage at which the N-channel MOS transistor N2 becomes conductive, so that the input signal to the level shifter LS is fixed and the operation is stabilized. After that, when the power supply VDD1 rises, the N-channel MOS transistor Nbc becomes conductive. In this case, a complementary signal to a signal inputted to the node ND1 is inputted to the node ND4 from the input voltage signal VIN through the inverter circuits INV1 and INV2 and the bias circuit BC, and the level shifter LS operates in a stable manner.

In this manner, by using the bias circuit BC shown in FIG. 3, the problem of unstable operation of the level shifter at the time of power activation can be solved as with the bias circuit BC shown in FIG. 2. Further, in the bias circuit BC of FIG. 3, by using the P-channel MOS transistor Pbc and the N-channel MOS transistor Nbc, a layout area can be made smaller than that of the resistance element R1 in the bias circuit BC of FIG. 2.

FIG. 4 shows a schematic diagram of a layout of the semiconductor device shown in FIG. 2. In a layout configuration shown in FIG. 4, the same reference numerals are used for portions corresponding to those in the configuration shown in FIGS. 1 and 2.

In FIG. 4, the layout of the entire semiconductor device shown in FIG. 2 is shown in three blocks. The three blocks are an inverter block INVB including the level shifters INV1 and INV2, an input signal fixing block IFB including the current generating circuit GC and the bias circuit BC, and a level shifter block LSB including the level shifter LS.

The layout of the conventional level shifter circuit LSC shown in FIG. 9 is the layout formed of the inverter block INVB and the level shifter block LSB. The layout of the present invention is obtained by adding the input signal fixing block IFB to the conventional layout. An operation of the input signal fixing block is for applying a current between the same and the inverter circuit INV2, thereby fixing a condition of the input signal to the level shifter LS by using the current, as described on the operation of FIG. 2. That is, the input signal fixing block IFB operates through both of the inverter block INVB and the level shifter block LSB. Therefore, in the layout of the present invention, the layout area can be made smaller by arranging the input signal fixing block IFB between the inverter block INVB and the level shifter block LSB.

Third Embodiment

Figure 5:
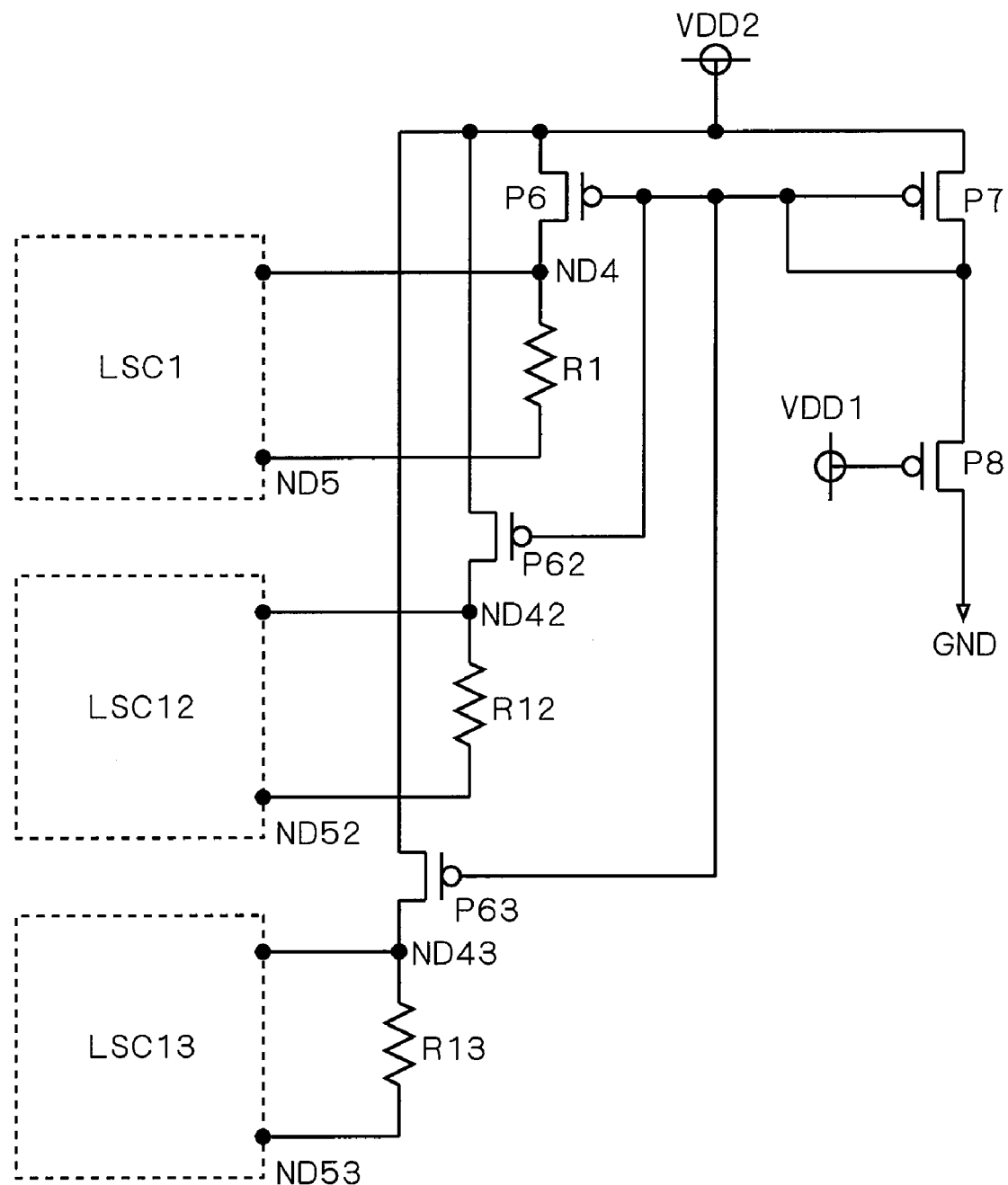
FIG. 5 is a schematic diagram showing an entire configuration of a semiconductor device according to a third embodiment of the present invention.

FIG. 5 is a schematic diagram showing an entire configuration of a semiconductor device according to a third embodiment of the present invention. In the circuit configuration shown in FIG. 5, the same reference numerals are used for portions corresponding to those in the configurations shown in FIGS. 1 and 2, and a detailed description thereof is not given.

The semiconductor device shown in FIG. 5 further has level shifter circuits LSC12 and LSC13, P-channel MOS transistors P62 and P63, resistance elements R12 and R13, and nodes ND42, ND43, N52 and N53, in addition to the configuration of the semiconductor device shown in FIG. 2.

As shown in FIG. 5, a plurality of level shifter circuits (a case of three level shifter circuits is shown as one example, in FIG. 5) have part of the current generating circuit GC (P-channel MOS transistors P7 and P8) in common. In the semiconductor device having a plurality of level shifter circuits, if configured as shown in FIG. 5, an entire area of the circuit may be made smaller than that of the configuration in which each of the level shifter circuits has the current generating circuit CG.

As shown in FIG. 5, in the semiconductor device having a plurality of level shifter circuits, the current generating circuit CG using a current mirror circuit is used in a portion of a circuit for increasing the voltages of input signals to a plurality of level shifters, in order to prevent unstable operation. In this case, the plurality of level shifter circuits may use the portion of the current generating circuit CG in common, and an entire semiconductor device can be realized by a small-scale circuit configuration.

Fourth Embodiment

FIG. 6 is a schematic diagram showing an entire configuration of a current generating circuit CG according to a fourth embodiment of the present invention. In the circuit configuration shown in FIG. 6, the same reference numerals are used for portions corresponding to those in the configurations shown in FIGS. 1 and 2, and a detailed description thereof is not given.

The current generating circuit CG shown in FIG. 6 further includes P-channel MOS transistors P9 to P11 and N-channel MOS transistors N4 and N5, in addition to the configuration of the current generating circuit shown in FIG. 2.

The N-channel MOS transistor N5 is connected between the power supply VDD1 and a gate of the P-channel MOS transistor P8, and the gate is larger than a threshold voltage N5Vth of the N-channel MOS transistor N5 and receives a reference voltage Vref not larger than the voltage of the power supply VDD1 (N5Vth<Vref≦VDD1). Also, a back gate of the N-channel MOS transistor N5 receives the reference power supply GND.

The P-channel MOS transistor P10 and the N-channel MOS transistor N4 are connected in series between the power supply VDD2 and the reference power supply GND, a gate of the P-channel MOS transistor P10 is connected to the ND7, and a gate of the N-channel MOS transistor N4 receives the power supply VDD1. A node ND8 is between the P-channel MOS transistor P10 and the N-channel MOS transistor N4.

The P-channel MOS transistor P9 is connected between the power supply VDD2 and the node ND7, and the P-channel MOS transistor P11 is connected between the power supply VDD2 and a gate of the P-channel MOS transistor P8. Each gate of the P-channel MOS transistor P9 and the P-channel MOS transistor P11 is connected to the node ND8.

Also, the current driving ability of the N-channel MOS transistor N4 is sufficiently large in relation to the current driving ability (for example, a gate electrode width of the MOS transistor) of the P-channel MOS transistor P10. Also, the current driving ability of the P-channel MOS transistor P8 is sufficiently large in relation to the current driving ability of the P-channel MOS transistor P9. Further, the current driving ability of the N-channel MOS transistor N5 is sufficiently large in relation to the current driving ability of the P-channel MOS transistor P11.

The P-channel MOS transistors P9 to P11 and the N-channel MOS transistors N4 and N5 are intended to prevent a leak current of the current generating circuit CG. Hereinafter, the rising operation at the time of power activation will be described.

First, a case in which the power supply VDD1 rises before the supply VDD2 does will be described. In this case, the power supply VDD2, which is the operation power supply of the current mirror in which the current generating circuit CG is included, has not risen, so that a current does not flow from the current generating circuit CG to the node ND4. In this case, in the level shifter LS, the power supply VDD1 rises before the power supply VDD2 does, so that no unstable operation occurs, and the level shifter LS operates in a stable manner.

Next, a case in which the power supply VDD2 rises before the power supply VDD1 does will be described. In this case, since the power supply VDD1 has not risen, the N-channel MOS transistor N4 is in a non-conduction state, and the N-channel MOS transistor N5 is in a conduction state. At this time, since the current driving ability of the N-channel MOS transistor N5 is sufficiently large in relation to the current driving ability of the P-channel MOS transistor P11, the P-channel MOS transistor P8 becomes conductive, and since the current driving ability of the P-channel MOS transistor P8 is sufficiently large in relation to the current driving ability of the P-channel MOS transistor P9, the P-channel MOS transistor P8 operates as a constant current source, so that a current flows from the current generating circuit CG to the node ND4 by the current mirror circuit configured by the P-channel MOS transistors P6 and P7. At this time, the P-channel MOS transistor P10 also becomes conductive, so that the node ND8 has the same electric potential as that of the VDD2, and the P-channel MOS transistors P9 and P11 become non-conductive. Also, the entire level shifter circuit operates in a way similar to the level shifter circuit LSC1 shown in FIG. 2.

Further, a case in which both of the power supplies VDD1 and VDD2 rise will be described. At this time, since the current driving ability of the N-channel MOS transistor N4 is sufficiently large in relation to the current driving ability of the P-channel MOS transistor P10, the node ND8 is drawn to the voltage of the reference power supply GND. The P-channel MOS transistors P9 and P11 become conductive by receiving the voltage of the node ND8 at the gate thereof. Each of the P-channel MOS transistors P6, P7 and P10 receives the power supply VDD2 at the gates thereof through the P channel MOS transistor P9. Since the P-channel MOS transistors P6, P7 and P10 also receive the power supply VDD2 at the sources thereof, the sources and the gates have the same electrical potential and become non-conductive. Also, the N-channel MOS transistor N5 becomes non-conductive at this time, and the gate of the P-channel MOS transistor P8 receives the power supply VDD2 through the P-channel MOS transistor P11, and the P-channel MOS transistor P8 becomes non-conductive.

At this time, since the P-channel MOS transistor P6, which is a path of the leak current between the current generating circuit CG and the level shifter circuit LSC1 is in a non-conduction state, the leak current can be prevented.

In addition to the effect of preventing unstable operation of the level shifter LS, the leak current generated due to the current generating circuit CG can be suppressed by making the circuit configuration in which the gate voltage and the source voltage of a transistor in the path of the current leak of the current generating circuit CG have the same potential after both of the power supplies VDD1 and VDD2 has risen. In the present embodiment also, as in the semiconductor device shown in FIG. 5, a plurality of level shifter circuits can have the current generating circuit CG in common, thereby making the area of the entire semiconductor device smaller.

A value larger than the threshold voltage N5Vth of the N-channel MOS transistor N5 and not larger than the voltage of the power supply VDD1 may be used for the reference voltage Vref used in the present embodiment, so that a wide voltage range can be taken. Also, if the reference voltage Vref is set within a range larger than the threshold voltage N5Vth of the N-channel MOS transistor N5 and not larger than the voltage of the power supply VDD1, it is not necessary to control a voltage condition of the reference voltage Vref according to the condition of the level shifter, and a control circuit need not be provided.

Fifth Embodiment

Figure 7:
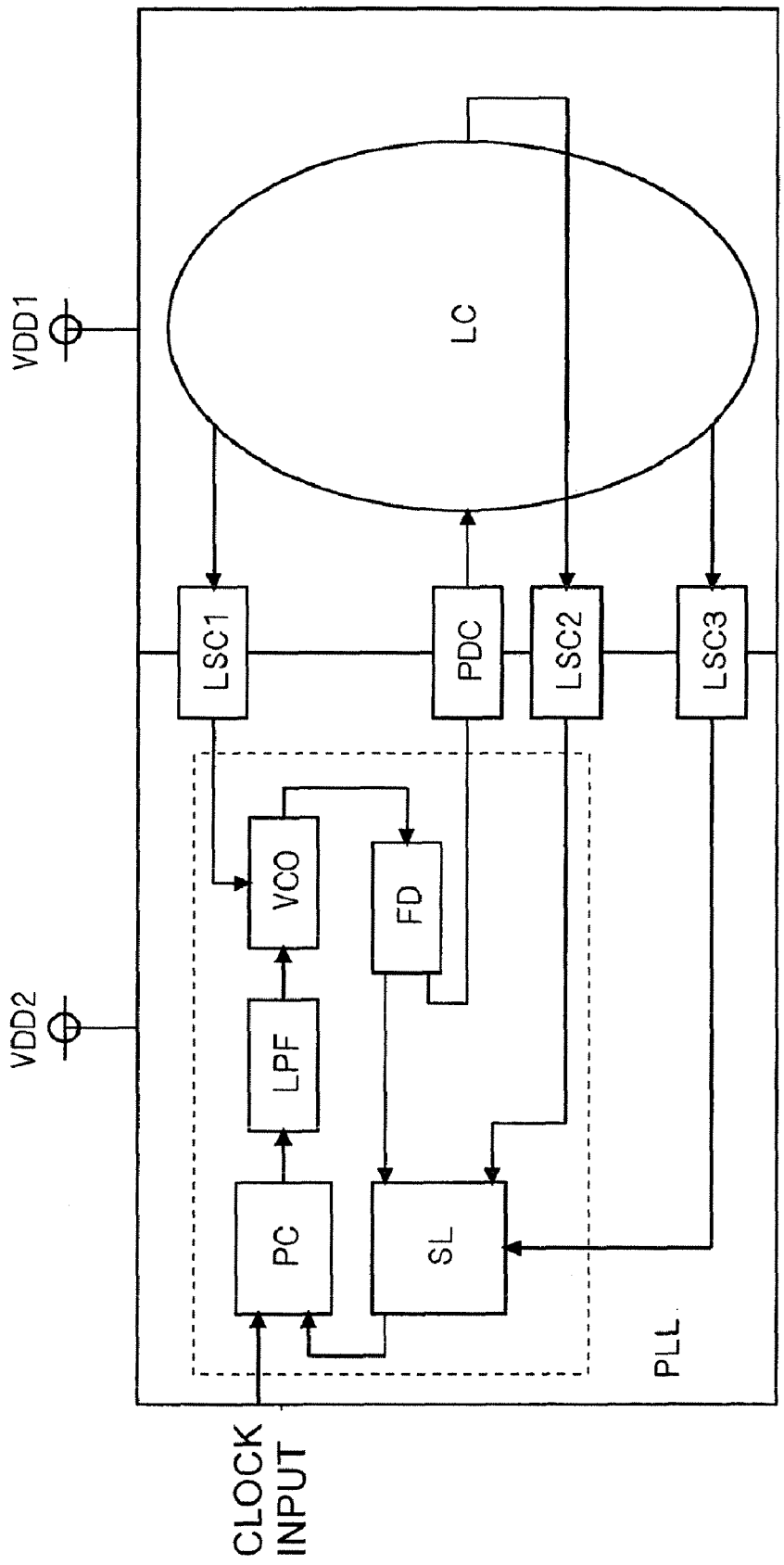
FIG. 7 is a schematic diagram showing an entire configuration of a system to which a level shifter circuit is applied, according to a fifth embodiment of the present invention.

FIG. 7 is a schematic diagram showing an entire configuration of a system to which a level shifter circuit is applied, according to a fifth embodiment of the present invention. As shown in FIG. 7, when using circuits of which power supply systems are different in combination, a level shift is required between the different power supply systems, as shown in FIG. 7.

This system is formed of a phase locked loop PLL configured by a VDD2-based circuit, a logic circuit LC configured by a VDD1-based circuit, and level shifter circuits LSC1 to LSC3 and a pull down circuit PDC connected between the phase locked loop PLL and the logic circuit LC. However, in this case, the voltages of the power supplies satisfy an equation of VDD<VDD2. The system is incorporated in an LSI (Large Scale Integration), for example.

The phase locked loop is disclosed, for example, in Japanese Patent Application Laid-Open Nos. 2005-20083 and 2003-78410.

The phase locked loop PLL shown in FIG. 7 is formed of a phase comparator PC, a low pass filter LPF, an oscillator VCO, a selector SL, and a frequency divider FD. The phase locked loop PLL supplies a clock signal to the logic circuit LC through the pull down circuit PDC. In addition, the phase locked loop PLL is controlled by the logic circuit LC through the level shifter circuits LSC1 and LSC3. The oscillator VCO of the phase locked loop PLL oscillates when the signal inputted from the level shifter circuit LSC1 is an activation signal, and stops when the signal is a non-activation signal.

In addition, the selector SL outputs the signal from the frequency divider FD directly to the phase comparator PC when the signal inputted from the level shifter circuit LSC3 is a non-activation signal, and outputs the clock signal fed back from the logic circuit LC through the level shifter circuit LSC2 to the phase comparator PC when the signal is an activation signal. Within the phase locked loop PLL, the phase comparator PC compares phases of the clock input from the outside and of the fed back signal, and the oscillator VCO is controlled with the signal obtained by removing a high-frequency component from the output by the low pass filter LPF.

The level shifter circuit LSC as shown in FIG. 9 has been conventionally applied to the level shifter circuits LSC1 to LSC3. In a case where the power supply VDD1 is off and the power supply VDD2 is on, the output of the level shifter circuit LSC becomes unstable as described regarding FIG. 9.

At this time, in the system shown in FIG. 7, an operational problem occurs when the output signals of the level shifter circuits LSC1 and LSC3 are activation signals. That is, when the output signals of the level shifter circuits LSC1 and LSC3 become activation signals, the oscillator VCO oscillates. Also, since the power supply VDD1 is in an off state and the logic circuit LC does not operate, a clock signal is not inputted to the phase comparator PC through the selector SL. Therefore, the oscillator VCO is not properly controlled and operates at the maximum oscillation frequency possible. Therefore, there occurs a problem that current is consumed more than in the normal operation.

Also, when the power supply VDD1 is turned on from the above-described state, a clock higher than the frequency in the normal operation is inputted to the logic circuit LC until the oscillator VCO is properly controlled, and a large current flows just after the power supply VDD1 is activated.

Such an increase in power consumption might be a cause of an unintended voltage drop and an operational problem of the entire LSI mounting board.

By using the level shifter circuit shown in the present invention (for example, semiconductor device in FIG. 1) in the level shifter circuits LSC1 and LSC3, it is possible to fix the oscillator VCO to a stop state when only the power supply VDD1 is off, thereby avoiding problems caused by the unstable operation.

Sixth Embodiment

Figure 8:
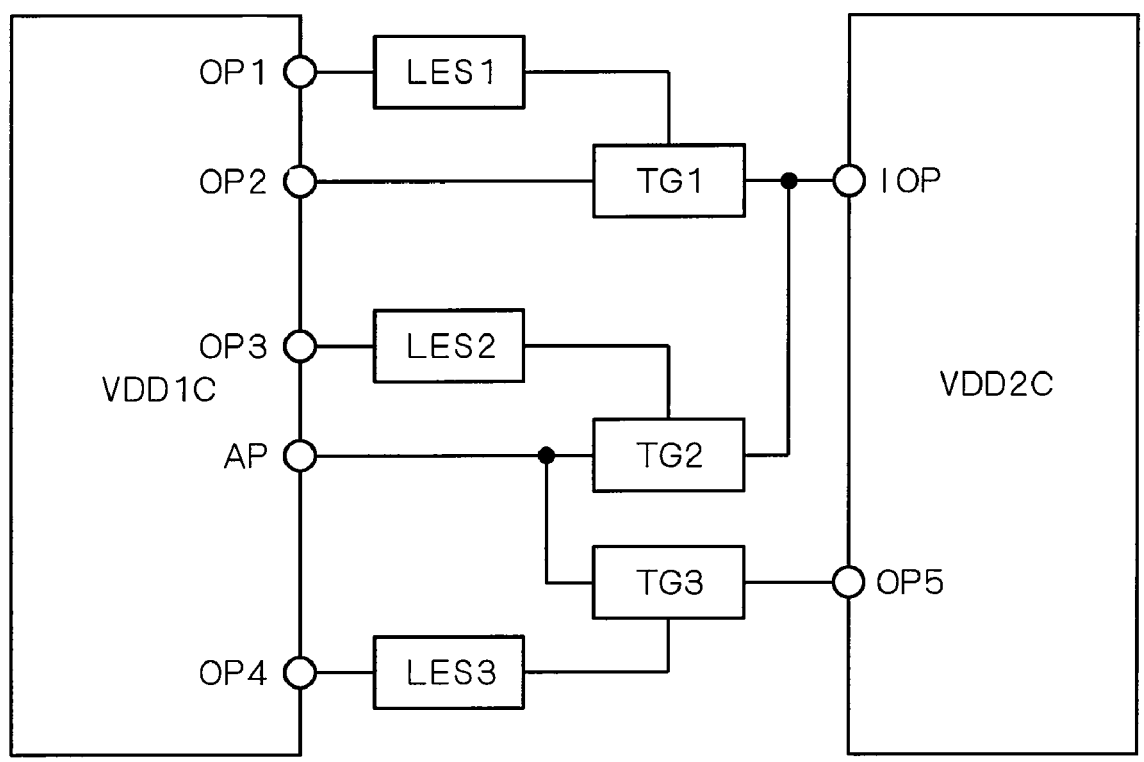
FIG. 8 is a schematic diagram showing an entire configuration of a system to which a level shifter circuit is applied, according to a sixth embodiment of the present invention.

FIG. 8 is a schematic diagram showing an entire configuration of a system to which a level shifter circuit is applied according to a sixth embodiment of the present invention.

In the circuit shown in FIG. 8, output ports OP1 to OP4 and an analog port AP are part of a circuit VDD1C, which has the power supply VDD1 as the operation power supply, and the input/output port IOP and the output port OP5 are part of a circuit VDD2C, which has the power supply VDD2 as the operation power supply. Meanwhile, the power supplies VDD1 and VDD2 satisfy an equation of power supply VDD1<power supply VDD2. Also, each of transmission gates TG1 to TG3 receives a signal converted to a power supply VDD2 level by the level shifter circuits LES1 to LES3 to operate.

A signal is inputted to the analog port AP from either of the input/output port IOP and the output port OP5. A signal is outputted from the input/output port IOP to the analog port AP or a signal is inputted from the output port OP2 to the input/output port IOP. The output port OP5 outputs a signal to the analog port AP. Further, it is selected by the transmission gates TG1 to TG3 which receive control signals inputted from the circuit VDD1C through the level shifter circuit, to and from which port the signal is inputted and outputted.

The transmission gate TG1 receives a control signal from the output port OP1 through the level shifter circuit LES1 to be controlled. The transmission gate TG2 receives a control signal from the output port OP3 through the level shifter circuit LES2 to be controlled. The transmission gate TG3 receives a control signal from the output port OP4 through the level shifter circuit LES3 to be controlled.

In the circuit having such paths, if the conventional level shifter circuit with the potentiality of unstable operation shown in FIG. 9 is used, the following problem occurs. When the power supply VDD1 is in an off state and the power supply VDD2 is in an on state, an unintended control signal is inputted to the transmission gates TG2 and TG3 due to the unstable operation of the level shifter circuits LES2 to LES3, so that there is a case in which both of the transmission gates TG2 and TG3 become conductive. At this time, a signal path is made also between the input/output port IOP and the output port OP5, and an unintended signal is inputted to the input/output port IOP, so that a false operation might occur in the circuit VDD2C.

In such a circuit, by using the level shifter circuit which can prevent unstable operation described in the first embodiment, for the level shifter circuits LES2 and LES3, the false operation in the entire circuit can be avoided.

In this way, in the transmission gate circuit controlled depending on the output of the level shifter circuit, there is a case in which an unintended signal path occurs due to the unstable operation of the level shifter circuit. By applying the present invention to the level shifter circuit, the generation of an unintended signal path can be avoided. Also, the circuit controlled by the level shifter circuit is not limited to transmission gates.

The present invention is capable of solving a problem of unstable operation at the time of power activation, and of realizing a level shifter circuit operating in a stable manner.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device to which a first power supply potential and a second power supply potential higher than said first power supply potential are supplied, the semiconductor device comprising:

an internal circuit operated by being supplied with said first power supply potential to output a first internal signal;

an inverter circuit operated by being supplied with said first power supply potential and having a P-channel MOS transistor and an N-channel MOS transistor within which a parasitic diode is formed to output a second internal signal obtained by inverting said first internal signal;

a level shifter circuit operated by being supplied with said second power supply potential and having a level shifter for outputting a level shift signal depending on said first and second internal signals, which are complementary to each other, inputted to first and second input terminals, respectively;

a current generating circuit including a current mirror circuit for supplying a current to a current path to a power supply node for supplying said first power supply potential to said inverter circuit through said parasitic diode, when said second power supply is inputted before said first power supply; and a bias circuit connected between said current generating circuit and said inverter circuit.

2. A semiconductor device to which a first power supply potential and a second power supply potential higher than said first power supply potential are supplied, the semiconductor device comprising:

an internal circuit operated by being supplied with said first power supply potential to output a first internal signal;

an inverter circuit operated by being supplied with said first power supply potential and having a P-channel MOS transistor and an N-channel transistor within which a parasitic diode is formed to output a second internal signal obtained by inverting said first internal signal;

a plurality of level shifter circuits operated by being supplied with said second power supply potential and each having a level shifter for outputting a level shift signal depending on said first and second internal signals, which are complementary to each other, inputted to first and second input terminals, respectively;

a current generating circuit including a current mirror circuit for supplying a current to a current path to a power supply node for supplying said first power supply potential to said inverter circuit through said parasitic diode, when said second power supply is inputted before said first power supply; and a plurality of bias circuits arranged to correspond to said plurality of level shifter circuits and connected between said current generating circuit and said inverter circuit.

\* \* \* \* \*